(12) United States Patent
Sakakibara et al.

(10) Patent No.: US 11,201,099 B2
(45) Date of Patent: Dec. 14, 2021

(54) SEMICONDUCTOR DEVICE AND METHOD OF MANUFACTURING THE SAME

(71) Applicant: DENSO CORPORATION, Aichi (JP)

(72) Inventors: Akinori Sakakibara, Toyota (JP); Takanori Kawashima, Anjo (JP); Takuya Kadoguchi, Toyota (JP); Kohji Uramoto, Toyota (JP); Yasuhiro Ogawa, Toyota (JP)

(73) Assignee: DENSO CORPORATION, Kariya (JP)

( * ) Notice: Subject to any disclaimer, the term of this patent is extended or adjusted under 35 U.S.C. 154(b) by 4 days.

(21) Appl. No.: 16/693,478

(22) Filed: Nov. 25, 2019

(65) Prior Publication Data

US 2020/0203252 A1 Jun. 25, 2020

(30) Foreign Application Priority Data

Dec. 21, 2018 (JP) .............................. JP2018-239956

(51) Int. Cl.
*H01L 23/373* (2006.01)
*H01L 21/48* (2006.01)

(52) U.S. Cl.
CPC ...... *H01L 23/3735* (2013.01); *H01L 21/4882* (2013.01)

(58) Field of Classification Search
CPC ... H01L 2224/0603; H01L 2224/33181; H01L 23/49811; H01L 23/49833; H01L 21/4882; H01L 23/3735
See application file for complete search history.

(56) References Cited

U.S. PATENT DOCUMENTS

| 8,125,080 B2 * | 2/2012 | Lee | H01L 24/40 257/724 |
| 9,324,630 B2 * | 4/2016 | Miyamoto | H01L 23/49562 |
| 9,748,166 B2 * | 8/2017 | Otremba | H01L 23/49586 |
| 10,115,798 B2 * | 10/2018 | Akiyama | H01L 21/283 |
| 10,698,021 B2 * | 6/2020 | Otremba | H01L 23/49541 |
| 2008/0017907 A1 * | 1/2008 | Otremba | H01L 28/40 257/306 |
| 2008/0093729 A1 * | 4/2008 | Siepe | H01L 23/3735 257/703 |
| 2008/0246137 A1 * | 10/2008 | Mahler | H01L 24/91 257/690 |
| 2011/0304039 A1 * | 12/2011 | Miyamoto | H01L 24/73 257/712 |

(Continued)

FOREIGN PATENT DOCUMENTS

| JP | 05-343591 A | 12/1993 |
| WO | 2012/096066 A1 | 7/2012 |

*Primary Examiner* — Nicholas J Tobergte
(74) *Attorney, Agent, or Firm* — Sughrue Mion, PLLC

(57) ABSTRACT

A semiconductor device may include a substrate constituted of an insulator; a first conductor film provided on a part of the substrate; a semiconductor chip located on the first conductor film; and an external connection terminal joined to the substrate via a joining layer at a position separated from the first conductor film. The semiconductor chip may be a power semiconductor chip including a main electrode and a signal electrode. The main electrode may be electrically connected to the first conductor film and the signal electrode may be electrically connected to the external connection terminal.

12 Claims, 8 Drawing Sheets

(56) References Cited

U.S. PATENT DOCUMENTS

| | | | |
|---|---|---|---|
| 2015/0035138 A1* | 2/2015 | Miyamoto | H01L 23/3142 257/712 |
| 2016/0035646 A1* | 2/2016 | Soyano | H01L 25/18 257/692 |
| 2016/0293528 A1* | 10/2016 | Otremba | H01L 23/49562 |
| 2020/0126925 A1* | 4/2020 | Michiaki | H01L 24/08 |

* cited by examiner

SEMICONDUCTOR DEVICE AND METHOD OF MANUFACTURING THE SAME

CROSS-REFERENCE TO RELATED APPLICATION

This application claims priority to Japanese Patent Application No. 2018-239956, filed on Dec. 21, 2018, the entire contents of which are incorporated herein by reference.

TECHNICAL FIELD

The technique disclosed herein relates to a semiconductor device and a method of manufacturing the same.

BACKGROUND

Japanese Patent Application Publication No. H05(1993)-343591 describes a semiconductor device. The semiconductor device includes a ceramic substrate, a semiconductor chip disposed on the ceramic substrate, and an external connection terminal joined to the substrate at a position separated from the semiconductor chip. The external connection terminal is electrically connected to the semiconductor chip via a conductor film (conductor wiring pattern) provided on the ceramic substrate.

SUMMARY

In the above-described semiconductor device, the semiconductor chip and the conductor film are connected to each other via a bonding wire. In contrast, if the conductor film and the semiconductor chip can be connected directly to each other without the bonding wire, the semiconductor device can be miniaturized. In particular, a plurality of conductor films can be individually formed (that is, formed to be separated from each other) on the ceramic substrate. Therefore, in a case where the semiconductor chip has a plurality of electrodes, conductor films that correspond to the respective electrodes can be individually provided.

In a case where a plurality of conductor films is provided on a ceramic substrate, certain intervals need to be provided between the adjacent conductor films so as to ensure insulation therebetween. In this regard, if the conductor films are formed by etching (particularly, wet etching), the side surface of each conductor film, which extends along the peripheral edge of the conductor film, has a flared shape. Therefore, in designing an arrangement of a plurality of conductor films, it is necessary to provide large intervals between the adjacent conductor films in consideration of such a shape of the side surfaces.

In general, conductor films with larger thickness have greater heat capacity, thus can suppress an increase in the temperature of a semiconductor chip. Due to this, conductor films may be thick to a certain extent. On the other hand, conductor films with larger thickness have the side surfaces with wider flared shape, which requires larger intervals between the adjacent conductor films. As mentioned above, conductor films with larger thickness require larger intervals between the adjacent conductor films, which results in an increase in the size of the semiconductor device. In view of the above circumstances, the disclosure herein provides a technique which can suppress an increase in the temperature of a semiconductor chip without increasing the size of a semiconductor device.

A semiconductor device disclosed herein may comprise: a substrate constituted of an insulator; a first conductor film provided on a part of the substrate; a semiconductor chip located on the first conductor film; and an external connection terminal joined to the substrate via a joining layer at a position separated from the first conductor film. The semiconductor chip may be a power semiconductor chip comprising a main electrode and a signal electrode. The main electrode may be joined to the first conductor film, and the signal electrode may be electrically connected to the external connection terminal.

In the above-described semiconductor device, the first conductor film is provided on the substrate constituted of the insulator, and the external connection terminal is joined to the substrate via the joining layer. Further, the main electrode of the semiconductor chip is joined to the first conductor film, and the signal electrode of the semiconductor chip is electrically connected to the external connection terminal. That is, among the two electrodes of the semiconductor chip, the signal electrode is connected to the external connection terminal without the conductor film on the substrate intervening therebetween. Since the external connection terminal is a member that is joined to the substrate via the joining layer, the external connection terminal can be manufactured by machining, such as pressing, and thus its shape can be precisely controlled. Therefore, even if the first conductor film is formed by etching, an interval required between the external connection terminal and the first conductor film is small, compared to an interval required between two conductor films formed by etching. Due to this, the semiconductor device can avoid an increase in size, even if the first conductor film is formed to be relatively thick.

Here, to further miniaturize the semiconductor device, it is considered that the first conductor film for the main electrode is also replaced with a separate member that is to be joined onto the substrate via a joining layer. However, due to the intervention of the joining layer between the separate member and the substrate, heat of the semiconductor chip discharged from the main electrode is dissipated to outside via the joining layer, which may cause an increase in the temperature of the semiconductor chip. For this reason, in the above-described semiconductor device, the first conductor film with excellent heat dissipation properties is prepared for the main electrode which greatly contributes to heat dissipation of the semiconductor chip, thereby suppressing an increase in the temperature of the semiconductor chip. Meanwhile, the signal electrode contributes less to the heat dissipation from the semiconductor chip. Therefore, even with the configuration where heat of the semiconductor chip discharged from the signal electrode is dissipated to outside via the joining layer, its influence on the temperature of the semiconductor chip can be ignored or tolerable.

In one embodiment of the present technique, a part of the semiconductor chip may be located on the external connection terminal, and the signal electrode may be joined to the external connection terminal. In this case, the signal electrode and the external connection terminal may be joined to each other via a conductive joining material, such as a solder material, although this is merely an example. Alternatively, the signal electrode and the external connection terminal may be joined to each other via another member, such as a spacer. With such a configuration, the external connection terminal is disposed in proximity to the first conductor film, thereby effectively achieving miniaturization of the semiconductor device. In another embodiment, the signal electrode and the external connection terminal may be disposed apart from each other, and the signal electrode and the external connection terminal may be electrically connected to each other via a bonding wire.

The disclosure herein also discloses a method of manufacturing a semiconductor device. The manufacturing method can manufacture, for example, the semiconductor device described above. The manufacturing method may comprise: partially etching a conductor film provided on a substrate constituted of an insulator to form a first conductor film covering a part of the substrate; joining an external connection terminal to the substrate via a joining layer at a position of the substrate separated from the first conductor film; placing a power semiconductor chip comprising a main electrode and a signal electrode above the first conductor film such that the main electrode faces the first conductor film; joining the main electrode of the power semiconductor chip to the first conductor film; and electrically connecting the signal electrode of the power semiconductor chip to the external connection terminal joined onto the substrate.

In the above-described manufacturing method, the placing of the power semiconductor chip on the first conductor film may comprise placing a part of the power semiconductor chip above the external connection terminal such that the signal electrode faces the external connection terminal. In this case, the electrically connecting of the signal terminal may comprise joining the signal electrode to the external connection terminal simultaneously with the joining of the main electrode.

DETAILED DESCRIPTION

Figure 1:
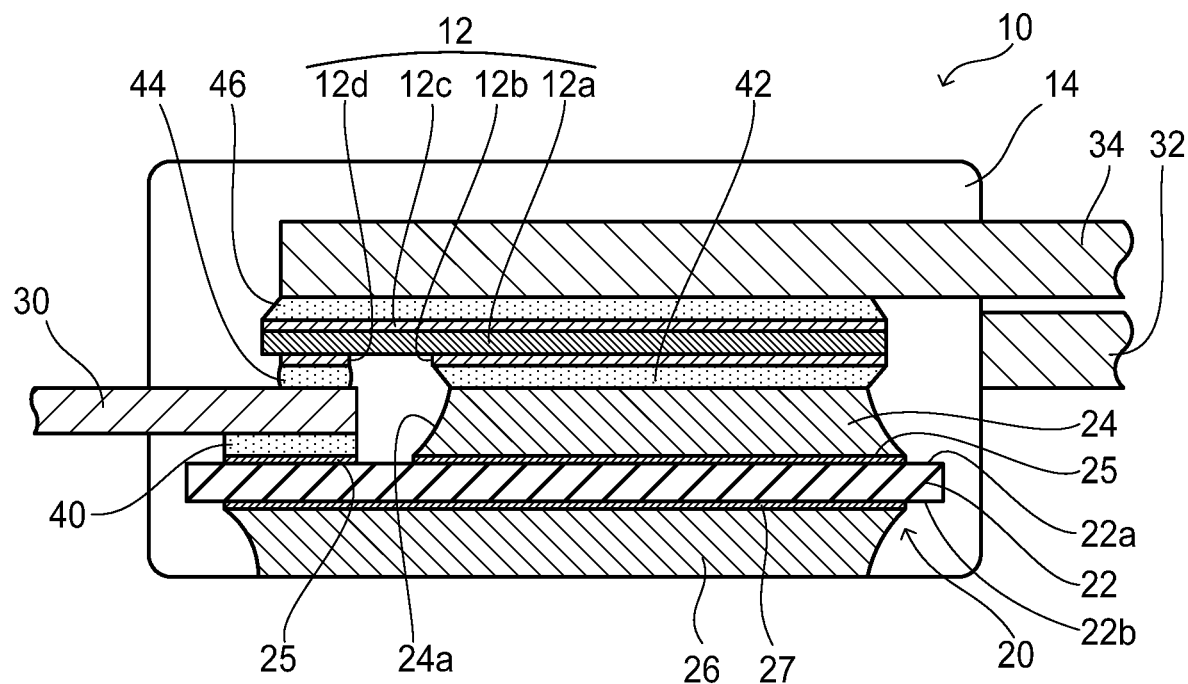
FIG. 1 is a cross-sectional view schematically showing a structure of a semiconductor device 10 of an embodiment.

In an embodiment of the present technique, a portion of the external connection terminal that is opposed to the signal electrode may protrude toward the signal electrode. With this configuration, a distance between the external connection terminal and the signal electrode can be appropriately adjusted, so the external connection terminal and the signal electrode can be properly joined together without an extra member, such as a spacer.

In an embodiment of the present technique, an angle of a side surface of the external connection terminal with respect to the substrate may be greater than an angle of a side surface of the first conductor film with respect to the substrate. As described above, when the first conductor film is formed by etching, the side surface of the first conductor film, which extends along its peripheral edge, often has a flared shape. When the side surface of the first conductor film has the flared shape, an angle of the side surface of the first conductor film with respect to the substrate is smaller than 90 degrees. If the side surface of the external connection terminal also has a flared shape with respect to such a first conductor film, a distance between the first conductor film and the external connection terminal on the substrate (i.e., so-called creepage distance) is short, which reduces insulation between the first conductor film and the external connection terminal. In other words, to ensure required insulation, an interval between the first conductor film and the external connection terminal needs to be made large. Due to this, the side surface of the external connection terminal may not have the flared shape, and even if it has the flared shape, a degree of the flaring may be small. That is, the angle of the side surface of the external connection terminal with respect to the substrate may be 90 degrees or may be greater than the angle of the side surface of the first conductor film with respect to the substrate.

In an embodiment of the present technique, a thickness of the first conductor film may be greater than a thickness of the external connection terminal. The first conductor film with larger thickness has greater heat capacity, thus suppresses an increase in the temperature of the semiconductor chip. In particular, the first conductor film is joined to the main electrode of the semiconductor chip and thus can receive a large amount of heat from the semiconductor chip. Therefore, by increasing the thickness of the first conductor film rather than that of the external connection terminal, an increase in the temperature of the semiconductor chip can be effectively suppressed.

In an embodiment of the present technique, the external connection terminal may comprise a first section being in contact with the joining layer and a second section extending from the first section toward outside the substrate. A thickness of the second section may be smaller than a thickness of the first section. With this configuration, the external connection terminal never contacts the substrate at the peripheral edge of the substrate. Thus, a creepage distance along the substrate between the external connection terminal and another member provided on the opposite side of the substrate to the external connection terminal can be made long.

In an embodiment of the present technique, the semiconductor chip may be a power semiconductor chip comprising an Insulated Gate Bipolar Transistor (IGBT) structure. In this case, the main electrode of the semiconductor chip may be connected to an emitter or a collector of the IGBT structure, and the signal electrode of the semiconductor chip may be connected to a gate of the IGBT structure. Alternatively, the semiconductor chip may be a power semiconductor chip comprising a Metal-Oxide-Semiconductor Field-Effect Transistor (MOSFET) structure. In this case, the main electrode of the semiconductor chip may be connected to a source or a drain of the MOSFET structure, and the signal electrode of the semiconductor chip may be connected to a gate of the MOSFET structure.

In an embodiment of the present technique, the substrate may be a ceramic substrate. Additionally or alternatively, the first conductor film may be joined onto the substrate via a brazing material. In this case, the brazing material may be an active metal brazing material. That is, the substrate and the first conductor film may configure a substrate formed by using an Active Metal Brazing (AMB) method, for example, an Active Metal Brazed Copper (AMC) substrate.

In an embodiment of the present technique, the semiconductor device may further comprise a second conductor film provided on an opposite side of the substrate with respect to the first conductor film. With this configuration, an increase in the temperature of the semiconductor chip can be suppressed by the heat capacity of the second conductor film. Furthermore, the presence of the conductor films on both sides of the substrate suppresses thermal deformation (particularly, warpage) caused in the substrate.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

A semiconductor device 10 of an embodiment will be described with reference to the drawings. The semiconductor device 10 is employed in, for example, a power controller of electric vehicle, and can constitute at least a part of a power conversion circuit, such as a converter or an inverter. The term "electric vehicle" as used herein broadly means vehicles that have motors for driving wheels, and includes, for example, electric vehicles charged with external electric power, hybrid vehicles having engines in addition to motors, fuel cell vehicles using fuel cells as power sources, and the like.

Figure 2:
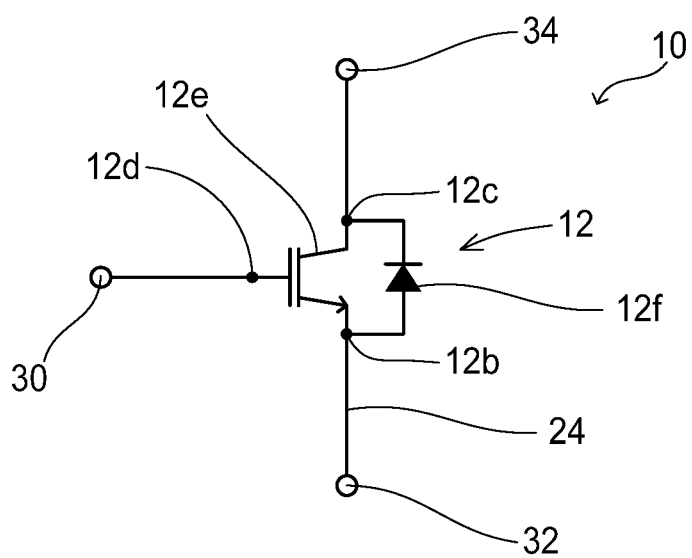
FIG. 2 is a circuit diagram of the semiconductor device 10.
Figure 3:
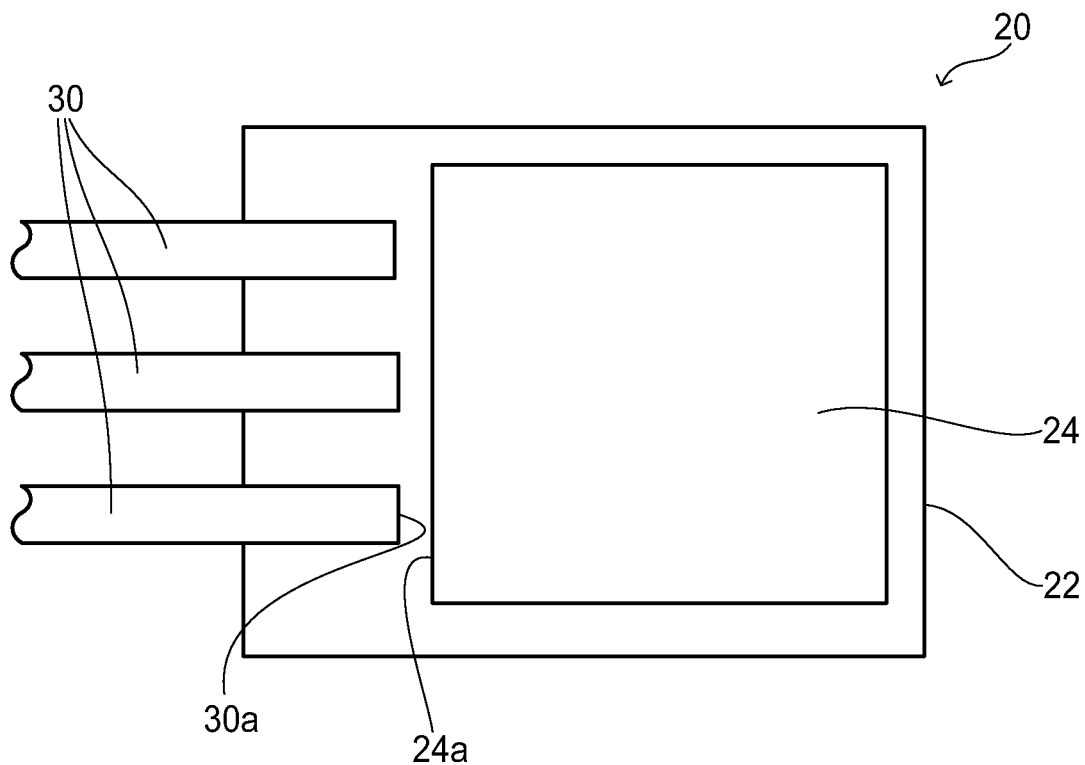
FIG. 3 is a plan view showing an insulated circuit substrate 20 and signal terminals 30.

As shown in FIGS. 1 to 3, the semiconductor device 10 includes a semiconductor chip 12 and an encapsulant 14 that encapsulates the semiconductor chip 12. The encapsulant 14 is constituted of an insulating material. The encapsulant 14 of the present embodiment is constituted of an encapsulating material, such as an epoxy resin, although not limited so. The encapsulant 14 has a substantially plate shape. In the accompanying drawings herein, hatching to be applied to a cross section of the encapsulant 14 is omitted for clarity of illustration.

The semiconductor chip 12 is a power semiconductor chip and includes a semiconductor substrate 12a and a plurality of electrodes 12b, 12c, and 12d. The plurality of electrodes 12b, 12c, and 12d includes a first main electrode 12b and a second main electrode 12c that are connected to a power circuit, and a plurality of signal electrodes 12d connected to a signal circuit. The semiconductor chip 12 is a switching element and is configured to establish and interrupt continuity between the first main electrode 12b and the second main electrode 12c, although not limited so. The first main electrode 12b and the plurality of signal electrodes 12d are located on one surface of the semiconductor substrate 12a, while the second main electrode 12c is located on another surface of the semiconductor substrate 12a.

The semiconductor chip 12 of the present embodiment includes an Insulated Gate Bipolar Transistor (IGBT) structure 12e, although not limited so. The first main electrode 12b is connected to an emitter of the IGBT structure 12e, the second main electrode 12c is connected to a collector of the IGBT structure 12e, and the signal electrodes 12d are connected to a gate of the IGBT structure 12e. In addition, the semiconductor chip 12 includes a diode structure 12f connected in parallel with the IGBT structure 12e. The first main electrode 12b is connected to an anode of the diode structure 12f, while the second main electrode 12c is connected to a cathode of the diode structure 12f. In another embodiment, the semiconductor chip 12 may include a Metal-Oxide-Semiconductor Field-Effect Transistor (MOSFET) structure. In this case, the first main electrode 12b is connected to a source of the MOSFET structure, the second main electrode 12c is connected to a drain of the MOSFET structure, and the signal electrodes 12d are connected to a gate of the MOSFET structure.

The semiconductor device 10 further includes an insulated circuit substrate 20. The insulated circuit substrate 20 includes an insulator substrate 22 constituted of an insulator, a first conductor film 24 provided on one surface 22a of the insulator substrate 22, and a second conductor film 26 provided on another surface 22b of the insulator substrate 22. The first conductor film 24 and the second conductor film 26 are joined to the insulator substrate 22 via brazing material 25 and 27, respectively. The first conductor film 24 is provided on a part of the insulator substrate 22, and an area of the first conductor film 24 is smaller than an area of the second conductor film 26. The first conductor film 24 is located inside the encapsulant 14, while the second conductor film 26 is exposed at a surface of the encapsulant 14. Thus, the insulated circuit substrate 20 also functions as a heat dissipating plate that dissipates heat inside of the encapsulant 14 (particularly, heat of the semiconductor chip 12) to outside of the encapsulant 14.

The semiconductor chip 12 is disposed on the first conductor film 24. The first main electrode 12b of the semiconductor chip 12 is opposed to the first conductor film 24 and is joined to the first conductor film 24 via a solder layer 42. Thus, the first main electrode 12b of the semiconductor chip 12 is electrically connected to the first conductor film 24. The first main electrode 12b of the semiconductor chip 12 is also thermally connected to the first conductor film 24. The first main electrode 12b and the first conductor film 24 may be joined to each other via any other type of joining layer that has conductivity, not via the solder layer 42. Moreover, another member, such as a conductor spacer, may be interposed between the first main electrode 12b and the first conductor film 24 as necessary.

The insulator substrate 22 of the present embodiment is a ceramic substrate, and is constituted of a ceramic, such as aluminum oxide, silicon nitride, or aluminum nitride. The first conductor film 24 and the second conductor film 26 are metal films and are constituted of metal, such as copper or aluminum. As mentioned above, the first conductor film 24 and the second conductor film 26 are joined to the insulator substrate 22 via the brazing material 25 and 27, respectively. The brazing material 25 and 27 are active metal brazing material in which active metal, such as titanium, has been added to brazing material that mainly contains silver and copper. This type of insulated circuit substrate 20 is also referred to as an Active Metal Brazed Copper (AMC) substrate. The insulated circuit substrate 20 may employ not only an AMC substrate but also, for example, a Direct Bonded Copper (DBC) substrate or a Direct Bonded Aluminum (DBA) substrate.

As an example, a thickness of the insulator substrate 22 may be 0.1 to 1.0 millimeters, and a thickness of each of the first conductor film 24 and the second conductor film 26 may be 0.05 to 1.0 millimeters. The thickness of each of the first conductor film 24 and the second conductor film 26 may be larger than the thickness of the insulator substrate 22. The first conductor film 24 and the second conductor film 26 with larger thickness have greater heat capacity, thus can effectively suppress an increase in the temperature of the semiconductor chip 12 during its operation.

The semiconductor device 10 further includes a plurality of external connection terminals 30, 32, and 34. Each of the external connection terminals 30, 32, and 34 is constituted of a conductor, such as metal (for example, copper), and extends to traverse inside and outside the encapsulant 14. The plurality of external connection terminals 30, 32, and 34 includes a plurality of signal terminals 30, a first power terminal 32, and a second power terminal 34. Each of the signal terminals 30 is joined to its corresponding one of the signal electrodes 12d of the semiconductor chip 12 via a solder layer 44. That is, the signal terminals 30 are electrically connected to the signal electrodes 12d of the semiconductor chip 12. The signal terminals 30 and the signal electrodes 12d may be joined to each other via another type of joining layers that have conductivity, not via the solder layers 44.

The first power terminal 32 is joined to the first conductor film 24 on the insulated circuit substrate 20 at a position that is not shown. Thus, the first power terminal 32 is electrically connected to the first main electrode 12b of the semiconductor chip 12 via the first conductor film 24. The second power terminal 34 is joined to the second main electrode 12c of the semiconductor chip 12 via a solder layer 46. Thus, the second power terminal 34 is electrically connected to the second main electrode 12c of the semiconductor chip 12.

Figure 4:
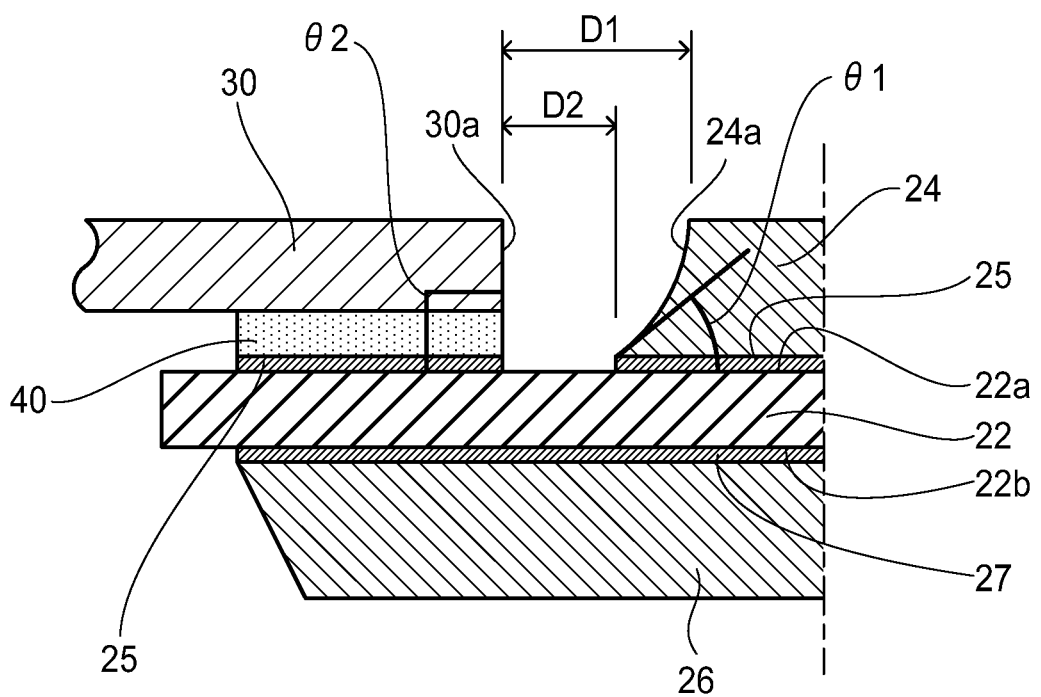
FIG. 4 is an enlarged view showing an interval between a first conductor film 24 and the signal terminal 30.

As shown in FIGS. 1 and 4, each signal terminal 30 is joined to the one surface 22a of the insulator substrate 22 via a joining layer 40, at a position separated from the first conductor film 24. Each joining layer 40 is a solder layer, although this is merely an example. The brazing material 25 is provided between each joining layer 40 and the insulator substrate 22. A thickness of the brazing material 25 is much smaller than a thickness of the joining layers 40. The joining layers 40 are not limited to solder and may be constituted of another material. The material of the joining layers 40 may be a conductive material or may be an insulating material. Herein, the brazing material 25 may be interpreted as a joining layer, together with the joining layers 40, which is located between the signal terminals 30 and the insulator substrate 22. That is, the joining layer (25 and 40) located between the signal terminals 30 and the insulator substrate 22 may have a multilayer structure constituted of different materials.

As described above, in the semiconductor device 10 of the present embodiment, the first conductor film 24 and the signal terminals 30 are disposed above the insulator substrate 22. A certain interval D2 is provided between the first conductor film 24 and each signal terminal 30, by which insulation therebetween is ensured. Although details will be described later in this regard, the first conductor film 24 is formed by etching. Thus, a side surface 24a extending along the peripheral edge of the first conductor film 24 has a flared shape, and it is difficult to control this shape precisely. Therefore, considering this shape of the side surface 24a, an interval D1 that is larger than the actual interval D2 needs to be provided between the first conductor film 24 and each signal terminal 30 in terms of design. If two conductor films are adjacent to each other, shapes of the side surfaces of the respective conductor films have to be taken into consideration, and in this case, an interval required between the two conductor films in terms of design is much larger.

In this regard, in the semiconductor device 10 of the present embodiment, the signal terminals 30, not other conductor films, are disposed adjacent to the first conductor film 24 on the insulator substrate 22. Further, the signal terminals 30 are electrically connected to the signal electrodes 12d of the semiconductor chip 12 without intermediation of any conductor film on the insulated substrate 22. The signal terminals 30 are members joined to the insulator substrate 22 via the joining layers 40 and the shape thereof can controlled precisely by being manufactured through machining, such as pressing. That is, an angle θ2 of a side surface 30a of each signal terminal 30 with respect to the insulator substrate 22 can be exactly set at, for example, 90 degrees, and thus can be set larger than an angle θ1 of the side surface 24a of the first conductor film 24 with respect to the insulated substrate 22. Therefore, even when the first conductor film 24 is formed by etching, the interval D1, which is required between each signal terminal 30 and the first conductor film 24 in terms of design, can be relatively small. Due to this, the semiconductor device 10 can avoid an increase in size even when the first conductor film 24 is formed to be relatively thick.

In the semiconductor device 10 of the present embodiment, a part of the semiconductor chip 12 is located above the signal terminals 30. Further, the signal electrodes 12d of the semiconductor chip 12 are joined to the signal terminals 30 via the solder layers 44. The signal electrodes 12d and the signal terminals 30 may be joined together via another type of joining layers that have conductivity, not via the solder layers 44. With this configuration, the signal terminals 30 are disposed in proximity to the first conductor film 24, which effectively miniaturizes the semiconductor device 10.

In the semiconductor device 10 of the present embodiment, the thickness of the first conductor film 24 is greater than the thickness of the signal terminals 30. The first conductor film 24 with larger thickness has greater heat capacity, thus can suppress an increase in the temperature of the semiconductor chip 12. In particular, the first conductor film 24 is joined to the first main electrode 12b of the semiconductor chip 12, and thus can receive a large amount of heat from the semiconductor chip 12. Therefore, an increase in the temperature of the semiconductor chip 12 can be effectively suppressed by increasing the thickness of the first conductor film 24 rather than that of the signal terminals 30.

Figure 5:
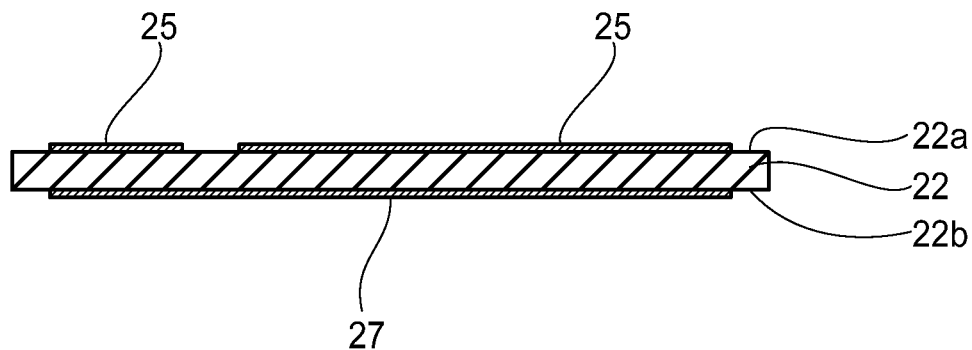
FIGS. 5 to 10 are diagrams each showing one or more steps in a method of manufacturing the semiconductor device 10.
Figure 6:
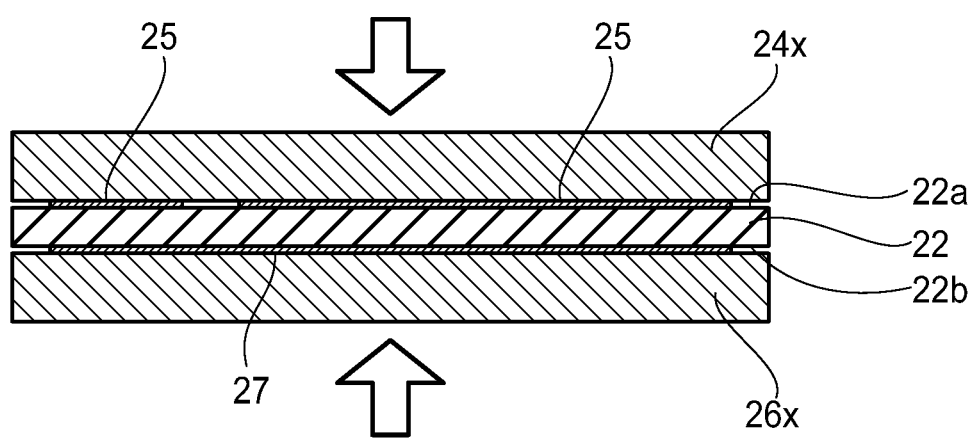

Next, a method of manufacturing the semiconductor device 10 will be described with reference to FIGS. 5 to 10. Firstly, as shown in FIG. 5, the insulator substrate 22 is prepared, and the brazing material 25 and 27 are applied to both surfaces 22a and 22b of the insulator substrate 22, respectively. As mentioned above, the brazing material 25 and 27 may be active metal brazing material. Then, as shown in FIG. 6, conductor plates 24x and 26x are joined to the both surfaces 22a and 22b of the insulator substrate 22, respectively. In this step, the conductor plates 24x and 26x placed on the both surfaces 22a and 22b of the insulator substrate 22 are pressed toward the insulator substrate 22 under an atmosphere at a temperature between, for example, 800 to 1000 degrees Celsius.

Figure 7:
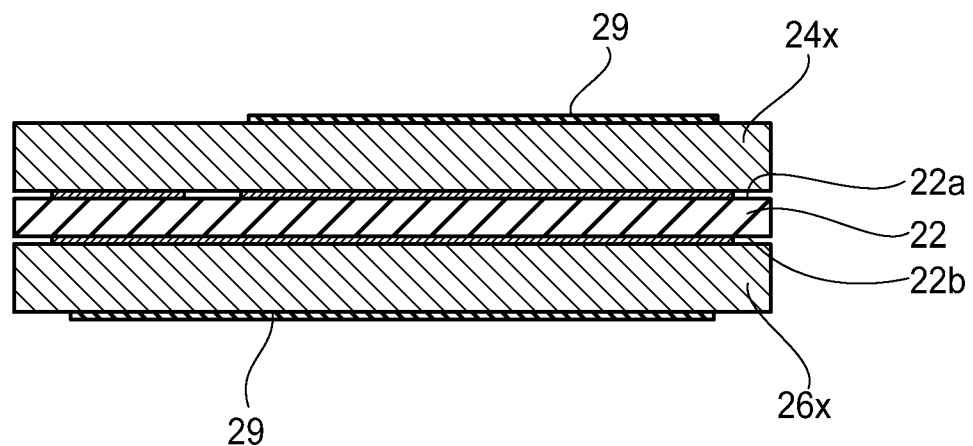
Figure 8:
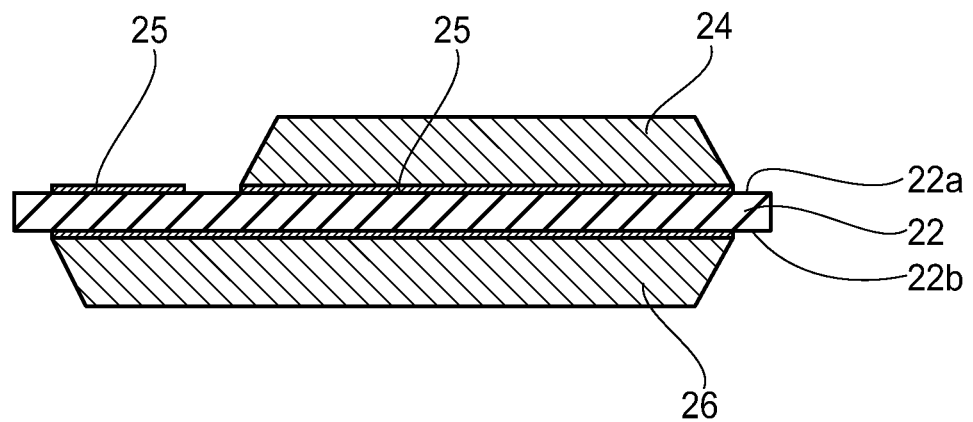

Then, as shown in FIG. 7, resist films 29 are formed on surfaces of the conductor plates 24x and 26x such that shapes thereof correspond to the shapes of the first conductor film 24 and the second conductor film 26. Subsequently, as shown in FIG. 8, the conductor plates 24x and 26x are partially removed by wet etching using chemical solution. Due to this, the first conductor film 24 and the second conductor film 26 are formed, and a part of the brazing material 25 provided on the insulator substrate 22 is exposed. Thereafter, the resist films 29 are removed.

Figure 9:
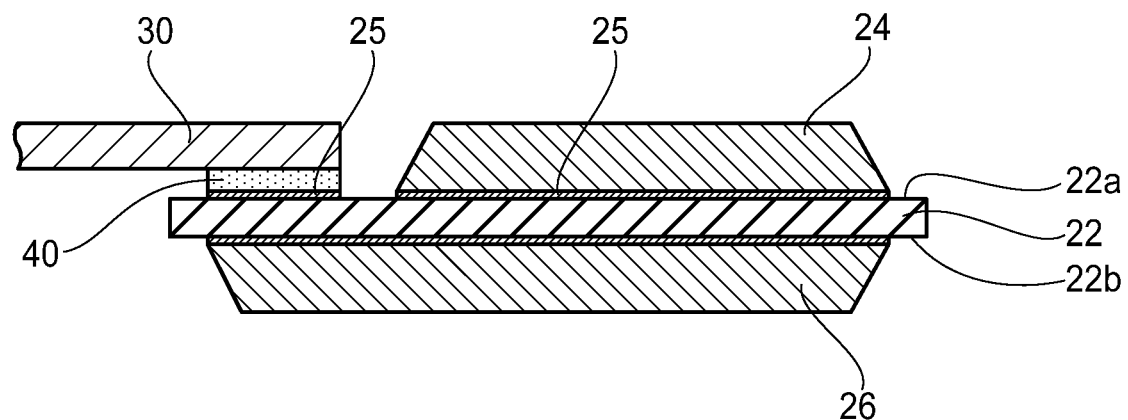

Then, as shown in FIG. 9, the signal terminals 30 are joined onto the brazing material 25 exposed on the insulator substrate 22, via the joining layers 40. The signal terminals 30 have already been processed into an intended shape (i.e., a product shape) by machining, such as pressing. The signal terminals 30 are joined at positions separated from the first conductor film 24 to ensure insulation from the first conductor film 24. The joining layers 40 may be solder layers and a reflow temperature for the solder layers at this time can be, for example, 300 degrees Celsius, although not limited so.

Figure 10:
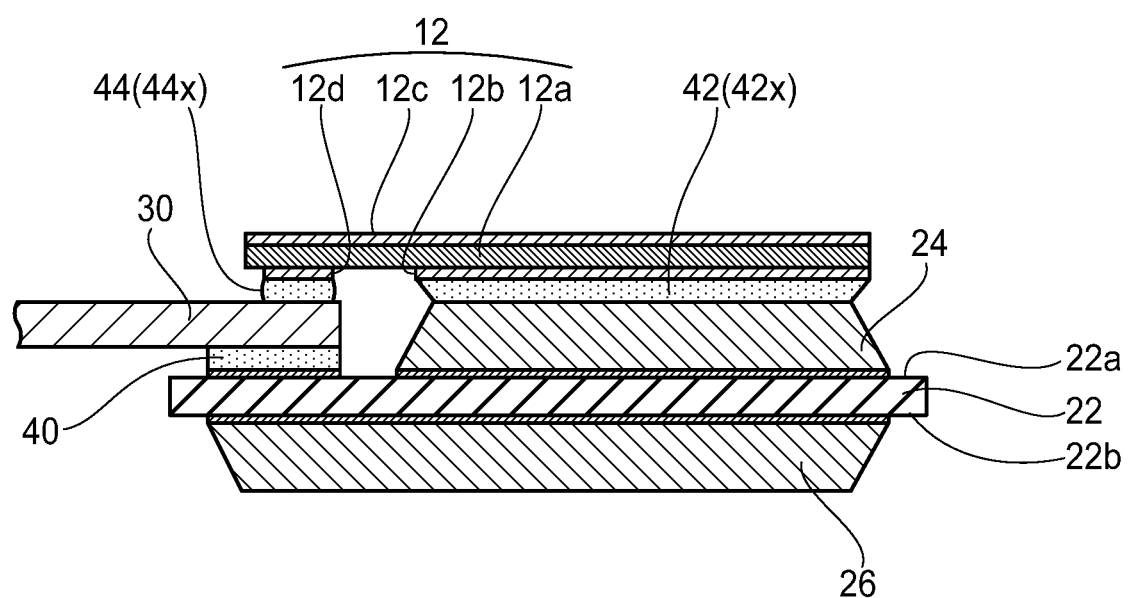

Then, as shown in FIG. 10, the semiconductor chip 12 is mounted on the first conductor film 24 and the signal terminals 30. In this step, firstly, the semiconductor chip 12 is placed on the first conductor film 24. At this time, the first main electrode 12b of the semiconductor chip 12 is oriented to face the first conductor film 24 and a solder sheet 42x is disposed between the first main electrode 12b and the first conductor film 24. In addition, a part of the semiconductor chip 12 is placed above the signal terminals 30, the signal electrodes 12d of the semiconductor chip 12 are oriented to face the signal terminals 30, and solder sheets 44x are disposed between the signal electrodes 12d and the signal terminals 30. Then, a reflow process is performed to melt and resolidify the solder sheets 42x and 44x. Consequently, the first main electrode 12b of the semiconductor chip 12 is joined to the first conductor film 24, and the signal electrodes 12d of the semiconductor chip 12 are joined to the signal terminals 30. Thereafter, other processes, including assembly of the power terminals 32, 34 and formation of the encapsulant 14, are performed, by which the semiconductor device 10 is completed. In the manufacturing method of the present embodiment, the step of joining the first main electrode 12b of the semiconductor chip 12 to the first conductor film 24 and the step of joining the signal electrodes 12d of the semiconductor chip 12 to the signal terminals 30 are performed simultaneously in the single reflow process. Alternatively, these two joining steps may be independently performed.

Figure 11:
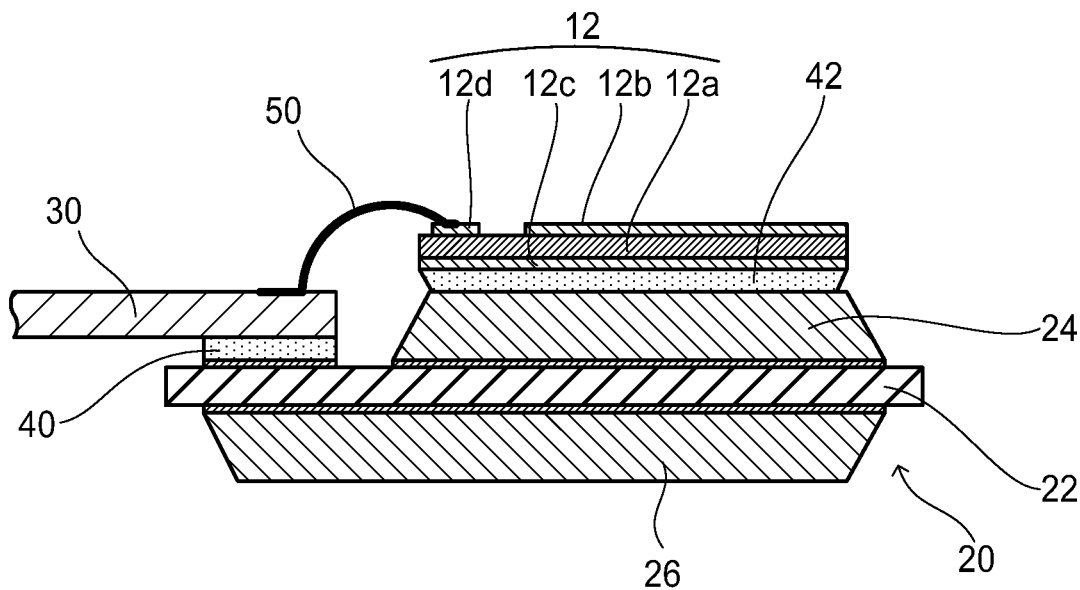
FIG. 11 shows a variant in which a signal electrode 12d and the signal terminal 30 are connected to each other by a bonding wire 50.

In the semiconductor device 10 of the present embodiment, the signal electrodes 12d of the semiconductor chip 12 are joined to the signal terminals 30 via the solder layers 44. Meanwhile, as shown in FIG. 11, the signal electrodes 12d and the signal terminals 30 may be connected to each other by bonding wires 50. Here, in the configuration shown in FIG. 11, the semiconductor chip 12 is reversed as compared to the configuration shown in FIG. 1, so the second main electrode 12c is joined to the first conductor film 24 via the solder layer 42. As such, the first conductor film 24 may be joined to either one of the two main electrodes 12b and 12c of the semiconductor chip 12.

Figure 12:
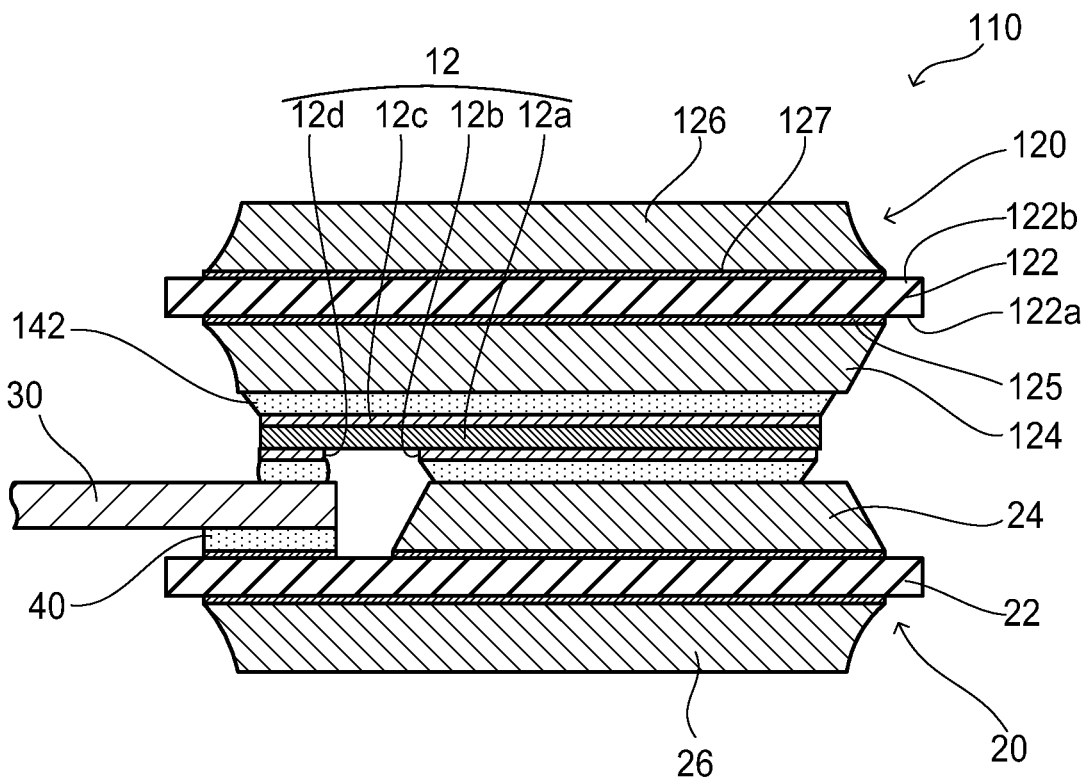
FIG. 12 shows a semiconductor device 110 of a variant with a second insulated circuit substrate 122 added thereto.

FIG. 12 shows a semiconductor device 110 of a variant. The semiconductor device 110 further includes a second insulated circuit substrate 120, compared to the above-described semiconductor device 10. The second insulated circuit substrate 120 includes a second insulator substrate 122 constituted of an insulator, a third conductor film 124 provided on one surface 122a of the second insulator substrate 122, and a fourth conductor film 126 provided on another surface 122b of the second insulator substrate 122. The third conductor film 124 and the fourth conductor film 126 are joined to the second insulator substrate 22 via brazing material 125 and 127, respectively. The third conductor film 124 is joined to the second main electrode 12c of the semiconductor chip 12 via a solder layer 142. Although not shown, the second power terminal 34 is electrically connected to the third conductor film 124, and the fourth conductor film 126 is exposed at a surface of the encapsulant 14.

Figure 13:
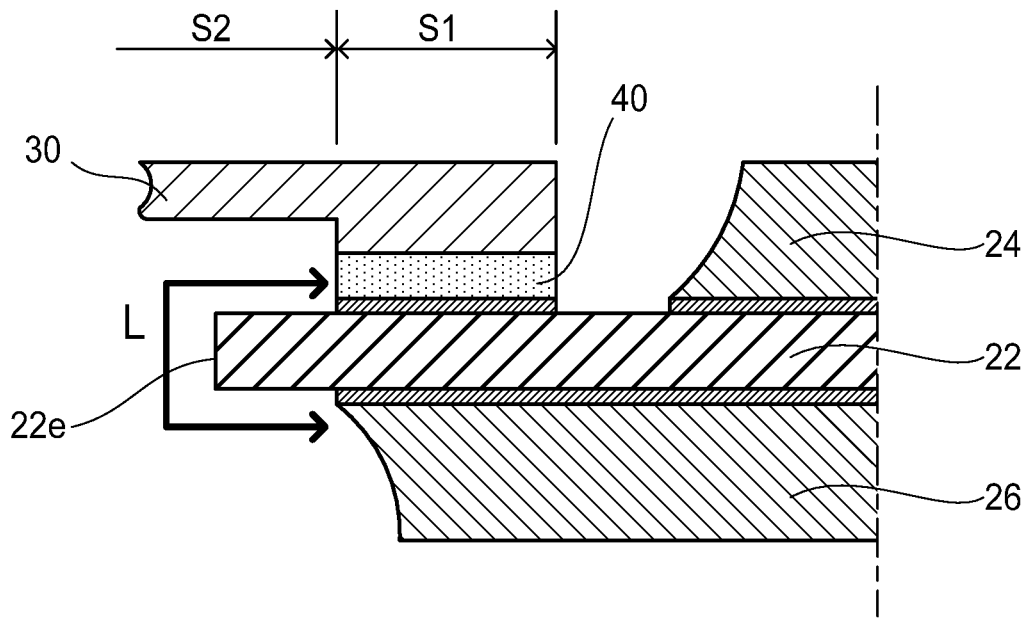
FIG. 13 is a diagram illustrating an example of the signal terminal 30 that includes a first section S1 and a second section S2.

In the above-described semiconductor devices 10 and 110, as shown in FIG. 13, each signal terminal 30 may include a first section S1 that is in contact with the joining layer 40 and a second section S2 that extends from the first section S1 toward outside of the insulated substrate 22 and has a thickness smaller than a thickness of the first section S1. With this configuration, the signal terminals 30 never contact the insulator substrate 22 at a peripheral edge 22e of the insulator substrate 22. Thus, a creepage distance L along the insulator substrate 22 between the signal terminals 30 and the second conductor film 26 which is provided on the opposite side of the insulator substrate 22 to the signal terminals 30 can be made long.

Figure 14:
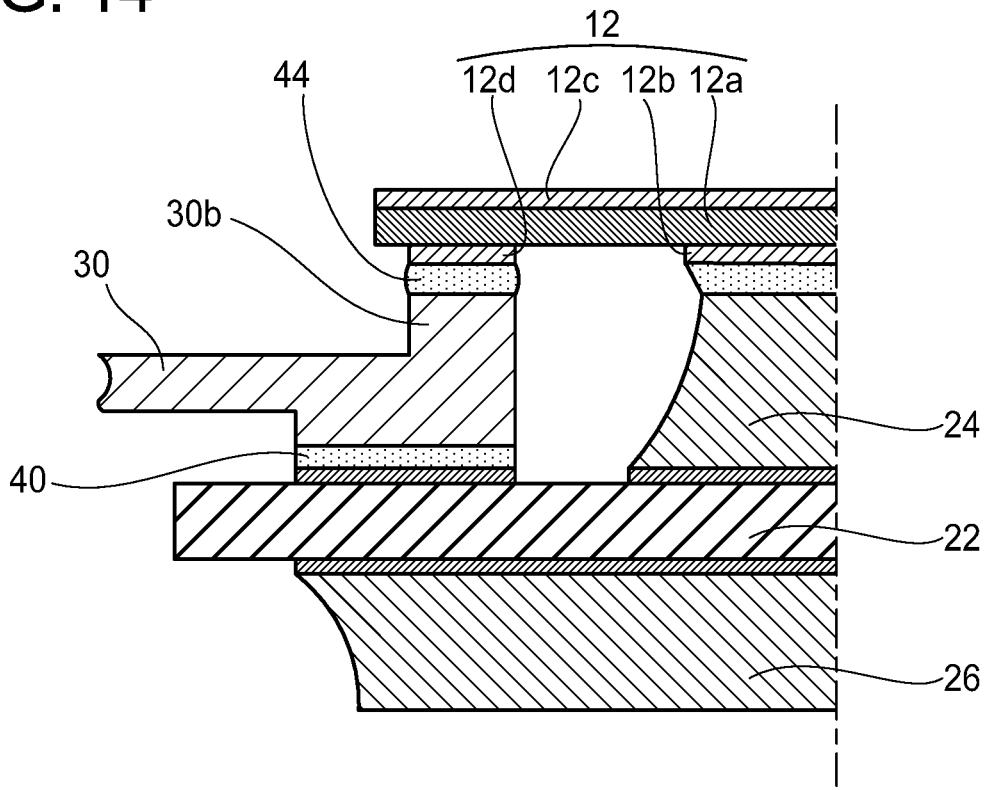
FIG. 14 is a diagram illustrating an example of the signal terminal 30 in which a portion 30b thereof opposed to the signal electrode 12d protrudes toward the signal electrode 12d.

As shown in FIG. 14, in the semiconductor devices 10 and 110 described above, a portion 30b of each signal terminal 30 that is opposed to the signal electrode 12d of the semiconductor chip 12 may protrude toward the signal electrode 12d. With this configuration, a distance between the signal terminals 30 and the signal electrodes 12d can be appropriately adjusted, so the signal terminals 30 and the signal electrodes 12d can be properly joined together without requirement of extra members, such as spacers. Further, excessive wetting and spread of the solder layers 44 can be suppressed, which avoids unintended short-circuiting, for example, between the signal electrodes 12d and the first main electrode 12b.

Figure 15:
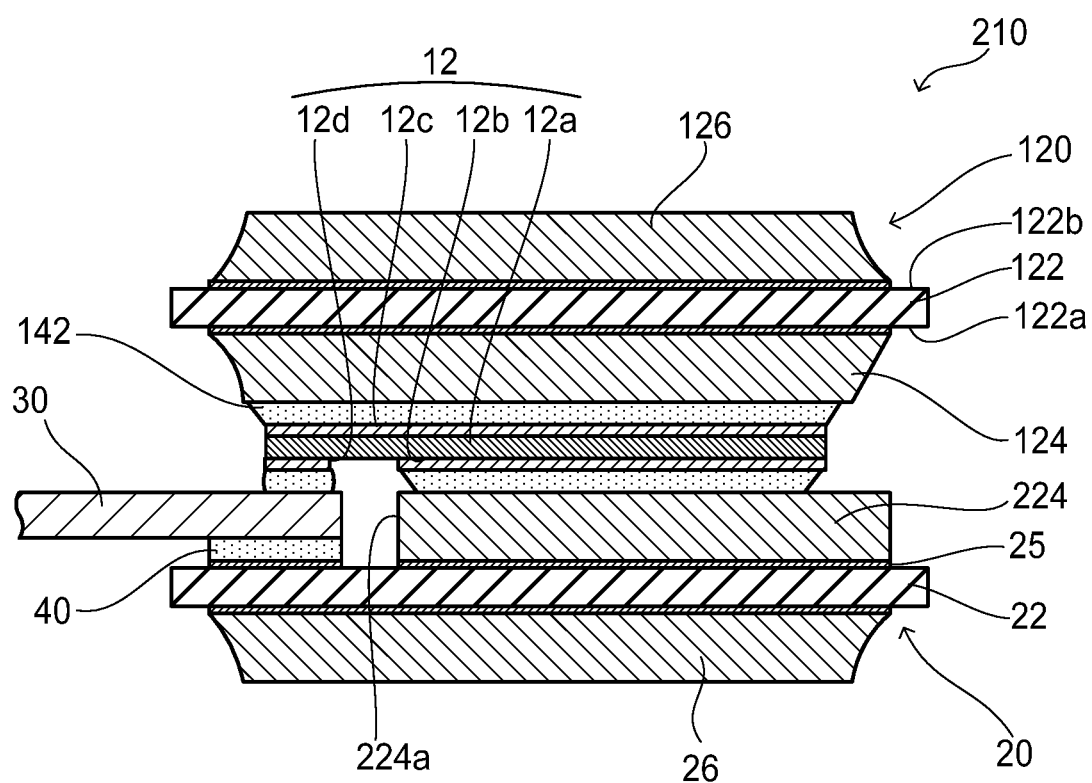
FIG. 15 is a diagram of a semiconductor device 210 of another variant in which a first conductor film 224 was formed without using etching.

FIG. 15 shows a semiconductor device 210 of another variant. The semiconductor device 210 of the present variant differs from the semiconductor device 110 of the above-described variant in a configuration of a first conductor film 224 of the insulator circuit substrate 20. Specifically, a side surface 224a of the first conductor film 224 does not have a flared shape and forms an angle of approximately 90 degrees with respect to the insulator substrate 22. This is because the first conductor film 224 is not formed by etching, but by producing a conductive plate with the same profile as that of the first conductor film 224 through machining and then joining the produced conductive plate to the insulator substrate 22. With this configuration, an interval between the first conductor film 224 and the signal terminals 30 is further reduced, by which the semiconductor device 210 can be miniaturized.

Various modifications can be made to the configurations of the above-described semiconductor devices 10, 110, and 210. For example, the semiconductor devices 10, 110, and 210 are not limited to include the single semiconductor chip 12 and may include a plurality of semiconductor chips 12. Although the example where the configuration of the external connection terminal according to the present technique is adopted to the signal terminals 30 has been described, the same configuration can be adopted to other terminals, such as the power terminals 32 and 34, similarly.

What is claimed is:

1. A semiconductor device, comprising:
a substrate constituted of an insulator;
a first conductor film provided on a part of the substrate;
a semiconductor chip located on the first conductor film; and
an external connection terminal joined to the substrate via a joining layer at a position separated from the first conductor film,
wherein
the semiconductor chip is a power semiconductor chip comprising a main electrode and a signal electrode,
the main electrode is electrically connected to the first conductor film and the signal electrode is electrically connected to the external connection terminal, and
a part of the semiconductor chip is located on the external connection terminal and the signal electrode is joined to the external connection terminal.

2. The semiconductor device according to claim 1, wherein a portion of the external connection terminal that is opposed to the signal electrode protrudes toward the signal electrode.

3. The semiconductor device according to claim 1, wherein an angle of a side surface of the external connection terminal with respect to the substrate is greater than an angle of a side surface of the first conductor film with respect to the substrate.

4. The semiconductor device according to claim 1, wherein a thickness of the first conductor film is greater than a thickness of the external connection terminal.

5. The semiconductor device according to claim 1, wherein
the external connection terminal comprises a first section being in contact with the joining layer and a second section extending from the first section toward outside the substrate, and
a thickness of the second section is smaller than a thickness of the first section.

6. The semiconductor device according to claim 1, wherein
the semiconductor chip is a power semiconductor chip comprising an Insulated Gate Bipolar Transistor (IGBT) structure,
the main electrode is connected to either an emitter or a collector of the IGBT structure, and
the signal electrode is connected to a gate of the IGBT structure.

7. The semiconductor device according to claim 1, wherein
the semiconductor chip is a power semiconductor chip comprising a Metal-Oxide-Semiconductor Field-Effect Transistor (MOSFET) structure,
the main electrode is connected to either a source or a drain of the MOSFET structure, and
the signal electrode is connected to a gate of the MOSFET structure.

8. The semiconductor device according to claim 1, wherein the substrate is a ceramic substrate.

9. The semiconductor device according to claim 1, wherein the first conductor film is joined to the substrate via a brazing material.

10. The semiconductor device according to claim 1, further comprising a second conductor film provided on an opposite side of the substrate with respect to the first conductor film.

11. A semiconductor device, comprising:
a substrate constituted of an insulator;
a first conductor film provided on a part of the substrate;
a semiconductor chip located on the first conductor film; and
an external connection terminal joined to the substrate via a joining layer at a position separated from the first conductor film,
wherein
the semiconductor chip is a power semiconductor chip comprising a main electrode and a signal electrode,
the main electrode is electrically connected to the first conductor film and the signal electrode is electrically connected to the external connection terminal, and
an angle of a side surface of the external connection terminal with respect to the substrate is greater than an angle of a side surface of the first conductor film with respect to the substrate.

12. A semiconductor device, comprising:
a substrate constituted of an insulator;
a first conductor film provided on a part of the substrate;
a semiconductor chip located on the first conductor film; and
an external connection terminal joined to the substrate via a joining layer at a position separated from the first conductor film,
wherein
the semiconductor chip is a power semiconductor chip comprising a main electrode and a signal electrode,
the main electrode is electrically connected to the first conductor film and the signal electrode is electrically connected to the external connection terminal,
the external connection terminal comprises a first section being in contact with the joining layer and a second section extending from the first section toward outside the substrate, and
a thickness of the second section is smaller than a thickness of the first section.

* * * * *